United States Patent
Zhao et al.

(10) Patent No.: US 8,749,072 B2
(45) Date of Patent: Jun. 10, 2014

(54) SEMICONDUCTOR PACKAGE WITH INTEGRATED SELECTIVELY CONDUCTIVE FILM INTERPOSER

(75) Inventors: Sam Ziqun Zhao, Irvine, CA (US);
Kevin Kunzhong Hu, Irvine, CA (US);
Sampath K. V. Karikalan, Irvine, CA (US); Rezaur Rahman Khan, Rancho Santa Margarita, CA (US); Pieter Vorenkamp, Laguna Niguel, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/405,186

(22) Filed: Feb. 24, 2012

(65) Prior Publication Data
US 2013/0221525 A1    Aug. 29, 2013

(51) Int. Cl.
*H01L 23/48*    (2006.01)
*H01L 21/00*    (2006.01)

(52) U.S. Cl.
USPC ............. 257/777; 257/686; 257/E25.006; 257/E25.021; 257/E25.027; 257/E23.085; 438/109

(58) Field of Classification Search
USPC .......... 257/686, 777, E25.006, E25.013, 257/E25.021, E25.027, E23.085; 438/109, 438/FOR. 368, FOR. 426
See application file for complete search history.

(56) References Cited

U.S. PATENT DOCUMENTS

| | | |
|---|---|---|
| 5,198,963 A | 3/1993 | Gupta |
| 6,002,168 A | 12/1999 | Bellaar |
| 6,188,578 B1 | 2/2001 | Lin |
| 6,448,636 B2 * | 9/2002 | Suenaga et al. ............. 257/678 |
| 6,461,895 B1 | 10/2002 | Liang |
| 6,709,898 B1 | 3/2004 | Ma |
| 6,743,661 B1 | 6/2004 | Drewery |
| 6,791,195 B2 * | 9/2004 | Urushima ................. 257/783 |
| 6,952,049 B1 | 10/2005 | Ogawa |
| 7,220,667 B2 | 5/2007 | Yamagata |
| 7,262,615 B2 | 8/2007 | Cheng |
| 7,585,702 B1 | 9/2009 | Wang |
| 7,675,163 B2 | 3/2010 | Heydari |
| 7,834,450 B2 | 11/2010 | Kang |
| 7,838,337 B2 | 11/2010 | Marimuthu |
| 7,901,986 B2 | 3/2011 | Arai |
| 8,008,125 B2 | 8/2011 | McConnelee |
| 8,021,927 B2 | 9/2011 | Khan |
| 8,022,555 B2 | 9/2011 | Hwang |
| 8,133,761 B2 | 3/2012 | Gerber |
| 8,188,594 B2 | 5/2012 | Ganesan |

(Continued)

FOREIGN PATENT DOCUMENTS

KR    10-2011-0036249    4/2011

*Primary Examiner* — Jasmine Clark
(74) *Attorney, Agent, or Firm* — McDermott Will & Emery LLP

(57) ABSTRACT

There are disclosed herein various implementations of semiconductor packages having a selectively conductive film interposer. In one such implementation, a semiconductor package includes a first active die having a first plurality of electrical connectors on a top surface of the first active die, a selectively conductive film interposer situated over the first active die, and a second active die having a second plurality of electrical connectors on a bottom surface of the second active die. The selectively conductive film interposer may be configured to serve as an interposer and to selectively couple at least one of the first plurality of electrical connectors to at least one of the second plurality of electrical connectors.

20 Claims, 3 Drawing Sheets

(56) References Cited

U.S. PATENT DOCUMENTS

| | | |
|---|---|---|
| 8,202,763 B2 | 6/2012 | Meyer |
| 8,310,063 B2 | 11/2012 | Wang |
| 8,344,516 B2 | 1/2013 | Chainer |
| 8,461,672 B2 | 6/2013 | Haba |
| 8,519,537 B2 * | 8/2013 | Jeng et al. .................... 257/738 |
| 2002/0030261 A1 * | 3/2002 | Rolda et al. .................. 257/685 |
| 2003/0036219 A1 | 2/2003 | Masumoto |
| 2005/0218518 A1 | 10/2005 | Jiang |
| 2005/0248015 A1 | 11/2005 | Palanduz |
| 2006/0145328 A1 | 7/2006 | Hsu |
| 2006/0186531 A1 | 8/2006 | Hsu |
| 2006/0186536 A1 | 8/2006 | Hsu |
| 2006/0220262 A1 | 10/2006 | Meyer |
| 2006/0244470 A1 | 11/2006 | Shinde |
| 2006/0258044 A1 | 11/2006 | Meyer |
| 2007/0132082 A1 | 6/2007 | Tang |
| 2007/0209831 A1 | 9/2007 | Sakamoto |
| 2007/0273049 A1 | 11/2007 | Khan |
| 2007/0290376 A1 | 12/2007 | Zhao |
| 2008/0044944 A1 | 2/2008 | Wakisaka |
| 2008/0128882 A1 | 6/2008 | Baek |
| 2008/0157322 A1 | 7/2008 | Tang |
| 2008/0157328 A1 | 7/2008 | Kawata |
| 2008/0246138 A1 | 10/2008 | Gerber |
| 2008/0268638 A1 | 10/2008 | Dertinger |
| 2009/0053858 A1 | 2/2009 | Ko |
| 2009/0102030 A1 | 4/2009 | Khan |
| 2009/0140415 A1 | 6/2009 | Furuta |
| 2010/0019360 A1 | 1/2010 | Khan |
| 2010/0084754 A1 | 4/2010 | Yoo |
| 2010/0133534 A1 | 6/2010 | Do |
| 2010/0301474 A1 | 12/2010 | Yang |
| 2011/0024888 A1 | 2/2011 | Pagaila |
| 2011/0024906 A1 | 2/2011 | Meyer |
| 2011/0241185 A1 | 10/2011 | Koester |
| 2011/0254160 A1 | 10/2011 | Tsai |
| 2011/0272819 A1 | 11/2011 | Park |
| 2011/0278732 A1 | 11/2011 | Yu |
| 2011/0285030 A1 | 11/2011 | Meyer |
| 2012/0009738 A1 | 1/2012 | Crawford |
| 2012/0018899 A1 | 1/2012 | Pagaila |
| 2012/0062439 A1 | 3/2012 | Liao |
| 2012/0139105 A1 | 6/2012 | Lin |
| 2012/0152605 A1 | 6/2012 | Das |
| 2012/0168942 A1 | 7/2012 | Gan |
| 2012/0211885 A1 | 8/2012 | Choi |
| 2012/0223429 A1 | 9/2012 | Khan |
| 2012/0225522 A1 | 9/2012 | Zhao |
| 2012/0228753 A1 | 9/2012 | Ko |
| 2012/0241921 A1 | 9/2012 | Lee |
| 2012/0292785 A1 | 11/2012 | Pagaila |
| 2012/0313240 A1 | 12/2012 | Cheng |
| 2012/0319284 A1 | 12/2012 | Ko |
| 2012/0319293 A1 | 12/2012 | Cheah |
| 2013/0000968 A1 | 1/2013 | Zhao |
| 2013/0062764 A1 | 3/2013 | Jin |
| 2013/0075917 A1 | 3/2013 | Law |
| 2013/0113098 A1 | 5/2013 | Hwang |
| 2013/0147023 A1 | 6/2013 | Lin |
| 2013/0181354 A1 | 7/2013 | Khan |

* cited by examiner

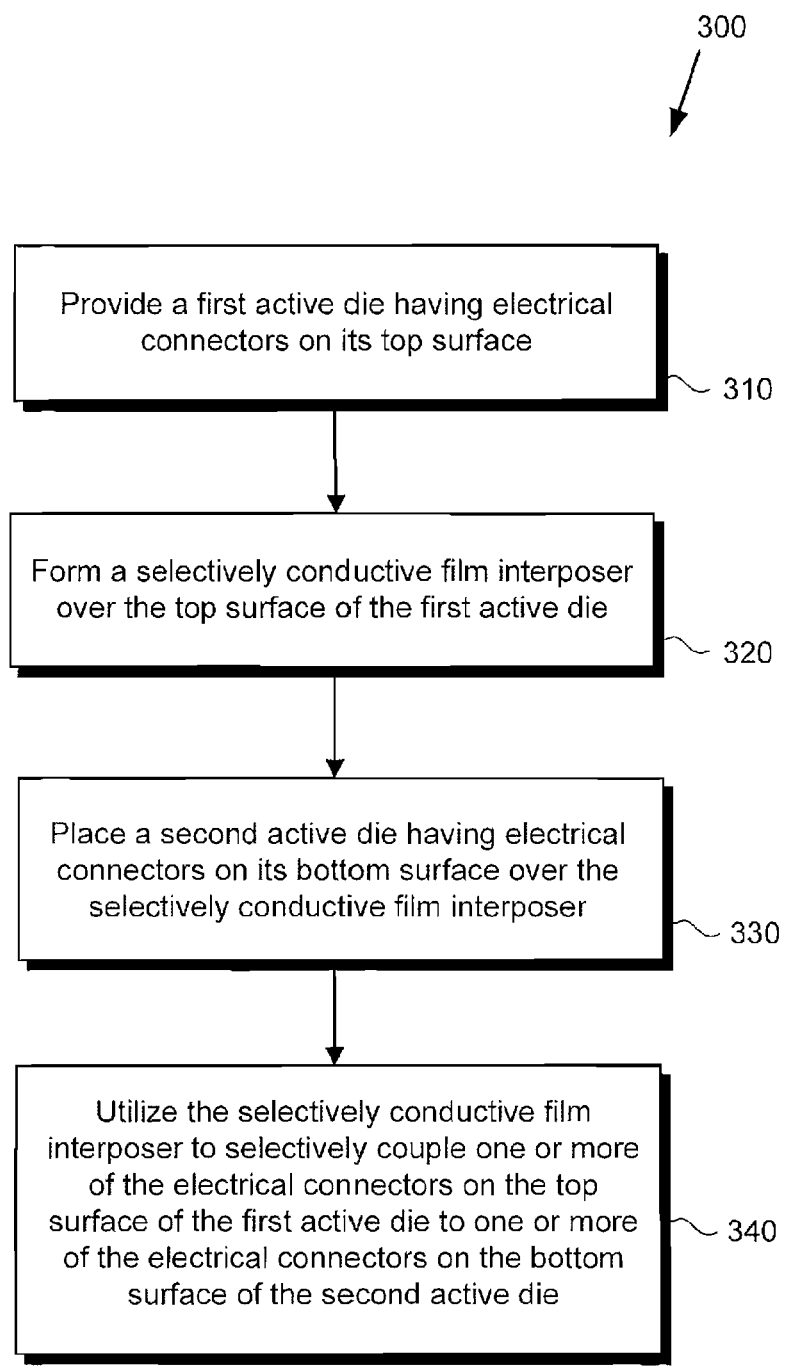

SEMICONDUCTOR PACKAGE WITH INTEGRATED SELECTIVELY CONDUCTIVE FILM INTERPOSER

BACKGROUND

Many widely used consumer electronic devices, such as mobile communication devices, for example, rely on integrated circuits (ICs) for their operation. As those electronic devices continue to increase in power and sophistication while often concurrently being reduced in size, IC density and packaging become increasingly important design constraints. In response, newer packaging solutions have been developed. One such packaging solution uses one or more interposers to facilitate interconnection of multiple active semiconductor dies within a single package.

A conventional interposer typically includes an interposer dielectric formed over a relatively thick semiconductor substrate, such as a silicon substrate. However, as the trend toward ever more massive integration continues through the co-packaging of more and more active dies, packaging space becomes increasingly precious. In view of these developments, the packaging space occupied by conventional interposers makes those conventional structures less desirable for use in massively integrated packaging implementations. In addition, conventional interposers can constrain the variety of packaging solutions achievable through their use. For example, conventional interposers may limit the range of techniques available for implementing die co-packaging and/or de-assembly.

SUMMARY

The present disclosure is directed to a semiconductor package with integrated selectively conductive film interposer, substantially as shown in and/or described in connection with at least one of the figures, and as set forth more completely in the claims.

BRIEF DESCRIPTION OF THE DRAWINGS

FIG. 3 shows a flowchart presenting an exemplary method for producing a semiconductor package having a selectively conductive film interposer.

DETAILED DESCRIPTION

Figure 1:
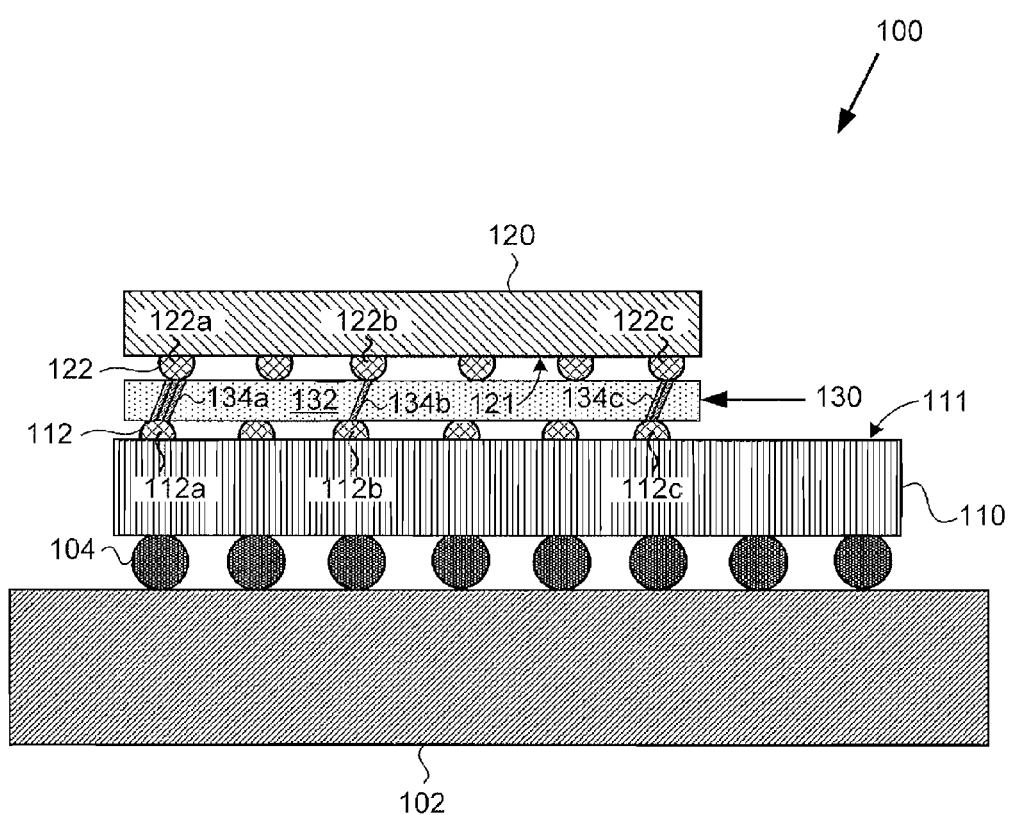
FIG. 1 shows a cross-sectional view of one implementation of a semiconductor package having a selectively conductive film interposer.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of one implementation of a semiconductor package having a selectively conductive film interposer. As shown in FIG. 1, semiconductor package 100 includes first active die 110, second active die 120, selectively conductive film interposer 130, and package substrate 102. It is noted that although package substrate 102 is presented in FIG. 1 as an aid to conceptual clarity, package substrate 102 is an optional feature, which, in some implementations, may be omitted. As further shown in FIG. 1, selectively conductive film interposer 130 includes interposer dielectric 132 having electrical conduction paths 134a, 134b, and 134c established therein. Also shown in FIG. 1 are solder balls 104 electrically connecting first active die 110 to package substrate 102, micro-bumps 112 including micro-bumps 112a, 112b, and 112c on top surface 111 of first active die 110, and micro-bumps 122 including micro-bumps 122a, 122b, and 122c on bottom surface 121 of second active die 120.

It is noted that although only one of solder balls 104 is specifically designated by that reference number in FIG. 1, any or all of the solder balls shown to connect first active die 110 to package substrate 102 may be characterized or referred to as solder balls 104. Moreover, any or all of the micro-bumps shown at top surface 111 of first active die 110, including micro-bumps 112a, 112b, and 112c, may be characterized or referred to as micro-bumps 112, while any or all of the micro-bumps shown at bottom surface 121 of second active die 120, including micro-bumps 122a, 122b, and 122c, may be characterized or referred to as micro-bumps 122.

First active die 110 and second active die 120 may be packaged or unpackaged dies, for example. Although the implementation shown in FIG. 1 depicts two active dies formed over package substrate 102 and selectively coupled together by selectively conductive film interposer 130, e.g., first active die 110 and second active die 120, in one implementation, several active dies in addition to first active die 110 and second active die 120 may be selectively coupled together by one or more selectively conductive film interposers, such as selectively conductive film interposer 130.

As shown by FIG. 1, first active die 110 has electrical connectors in the form of micro-bumps 112 on top surface 111 of first active die 110. Selectively conductive film interposer 130 is situated over first active die 110 and micro-bumps 112. In addition, according to the implementation shown in FIG. 1, second active die 120 including electrical connectors in the form of micro-bumps 122 on bottom surface 121 of second active die 120 is shown to overlie selectively conductive film interposer 130. As further shown in FIG. 1, selectively conductive film interposer 130 is configured to selectively couple at least one of micro-bumps 112 to at least one of microbumps 122. In other words, according to the present implementation, selectively conductive film interposer 130 is configured to provide electrical conduction path 134a for selectively coupling micro-bump 112a on top surface 111 of first active die 110 to micro-bump 122a on bottom surface 121 of second active die 120, as well as to selectively couple micro-bumps 112b and 112c to respective micro-bumps 122b and 122c by providing electrical conduction paths 134b and 134c, respectively.

As described above, selectively conductive film interposer 130 includes interposer dielectric 132 and electrical conduction paths 134a, 134b, and 134c established in interposer dielectric 132. Interposer dielectric 132 may be a flexible dielectric formed of a polyimide film or other suitable polymer matrix having conductive bodies dispersed therein for selectively providing electrical conduction paths, such as electrical conduction paths 134a, 134b, and 134c. As a specific example, in one implementation, selectively conductive film interposer 130 may be formed of a B-stage polymeric film serving as interposer dielectric 132 and having conductive bodies such as conductive nano-wires or conductive nanotubes dispersed therein. In some implementations, for example, such conductive bodies may be substantially uniformly distributed in interposer dielectric 132, and have their primary axes (e.g., length axis of nano-wire or nanotube) oriented substantially parallel to the plane of selectively conductive film interposer 130. An external field, such as an external electromagnetic field, for example, may be applied to interposer dielectric 132 to selectively reorient some of the conductive bodies dispersed therein so as to form electrical conduction paths 134a, 134b, and 134c. Selectively conductive film interposer 130 may then undergo a cure process, such as an ultra-violet (UV) cure or other radiation cure, for example, to establish electrical conduction paths 134a, 134b, and 134c.

According to the implementation shown in FIG. 1, first active die 110 and second active die 120 are electrically connected to selectively conductive film interposer 130 by micro-bumps 112 and 122, respectively. It is noted, however, that more generally, micro-bumps 112 and 122 may correspond to any electrical connectors suitable for coupling first active die 110 and/or second active die 120 to selectively conductive film interposer 130. Thus, in other implementations, micro-bumps 112 and/or 122 may be replaced by respective conductive posts or pillars such as, for example, metal posts or pillars formed of copper. Moreover, in other implementations, solder balls 104 may correspond to any conductive bodies suitable for forming stable electrical connections between first active die 110 and package substrate 102.

In contrast to conventional semiconductor packages, in which an interposer typically includes an interposer dielectric layer or semiconductor substrate and interposer metal layers for electrical connection, semiconductor package 100 is implemented using selectively conductive film interposer 130 from which an interposer semiconductor substrate has been omitted. In addition, and as shown by FIG. 1, selectively conductive film interposer 130 can be configured to establish an electrical conduction path between laterally displaced electrical connectors on adjacent active dies, e.g., microbump 112c on first active die 110 and microbump 122c on second active die 120, thereby relaxing alignment constraints within semiconductor package 100. Consequently, implementations utilizing selectively conductive film interposer 130 in place of conventional interposer structures may be advantageously optimized so as to enable massive integration.

Figure 2:
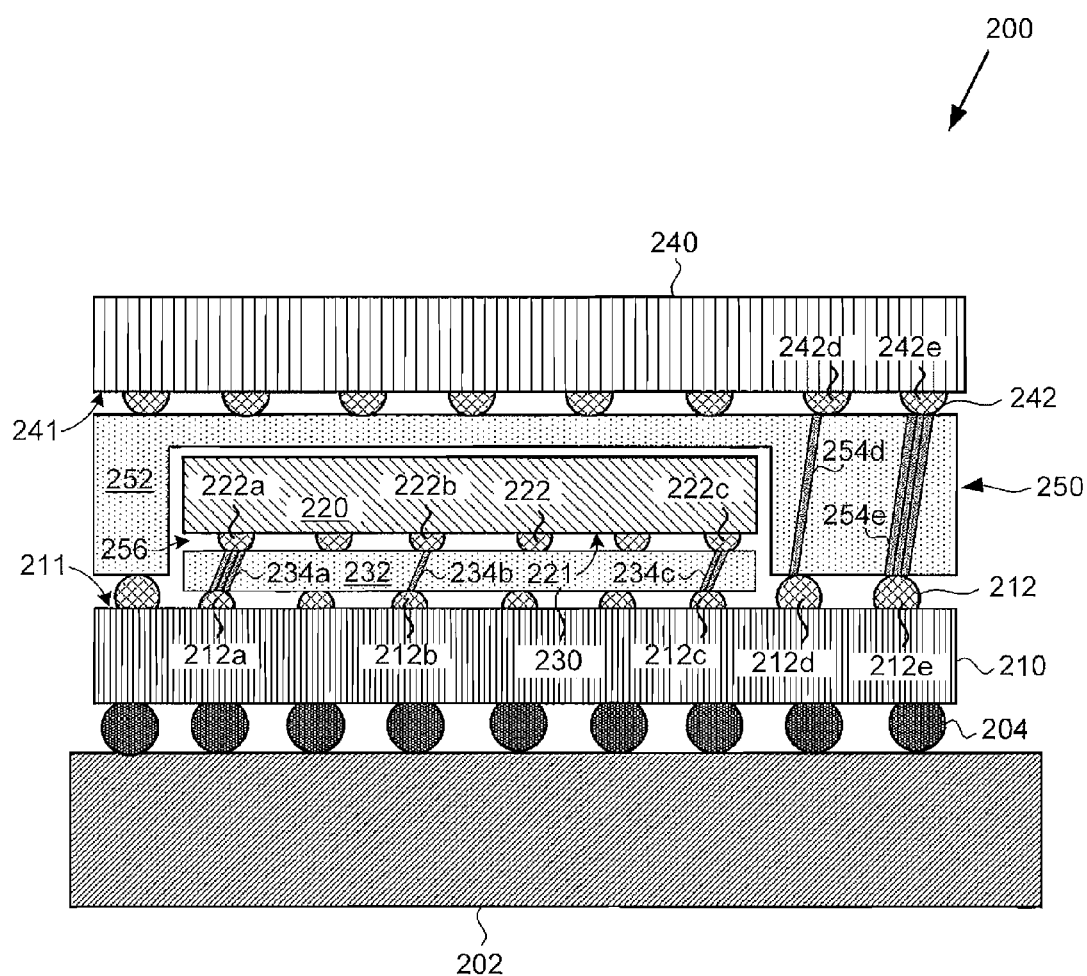
FIG. 2 shows a cross-sectional view of another implementation of a semiconductor package having a selectively conductive film interposer.

Moving now to FIG. 2, FIG. 2 shows a cross-sectional view of another implementation of a semiconductor package having a selectively conductive film interposer. As shown in FIG. 2, semiconductor package 200 includes first active die 210, second active die 220, first selectively conductive film interposer 230, third active die 240, second selectively conductive film interposer 250 including cavity 256, and package substrate 202. As further shown in FIG. 2, first selectively conductive film interposer 230 includes interposer dielectric 232 having electrical conduction paths 234a, 234b, and 234c established therein, while second selectively conductive film interposer 250 includes interposer dielectric 252 having electrical conduction paths 254d and 254e. Also shown in FIG. 1 are solder balls 204 electrically connecting first active die 210 to package substrate 202, micro-bumps 212 including micro-bumps 212a, 212b, 212c, 212d, and 212e on top surface 211 of first active die 110, micro-bumps 222 including micro-bumps 222a, 222b, and 222c on bottom surface 221 of second active die 220, and micro-bumps 242 including micro-bumps 242d and 242e on bottom surface 241 of third active die 240.

First active die 210, second active die 220, first selectively conductive film interposer 230 including electrical conduction paths 234a, 234b, and 234c, micro-bumps 212 and 222, solder balls 204, and package substrate 202 correspond respectively to first active die 110, second active die 120, selectively conductive film interposer 130 including electrical conduction paths 134a, 134b, and 134c, micro-bumps 112 and 122, solder balls 104, and package substrate 102, in FIG. 1, and may share the characteristics attributed to those corresponding features above.

It is noted that although only one of micro-bumps 242 is specifically designated by that reference number in FIG. 2, any or all of the micro-bumps shown at bottom surface 241 of third active die 240, including micro-bumps 242d and 242e, may be characterized or referred to as micro-bumps 242. It is further noted that although the implementation shown in FIG. 2 depicts three active dies and two selectively conductive film interposers, e.g., first active die 210, second active die 220, third active die 240, first selectively conductive film interposer 230, and second selectively conductive film interposer 250, in other implementations, semiconductor package 200 may contain many active dies, such as fifty active dies, for example, or one hundred active dies, selectively interconnected using any suitable number of selectively conductive film interposers.

As shown by FIG. 2, first active die 210 has electrical connectors in the form of micro-bumps 212 on top surface 211 of first active die 210. In addition, first selectively conductive film 230 is situated over first active die 210. Moreover, according to the implementation shown in FIG. 2, second active die 220 including electrical connectors in the form of micro-bumps 222 on bottom surface 221 of second active die 220 is shown to overlie first selectively conductive film interposer 230. Also, FIG. 2 shows that second selectively conductive film interposer 250 is situated over first and second active dies 210 and 220, while third active die 240 including electrical connectors in the form of micro-bumps 242 on bottom surface 241 of third active die 240 overlies second selectively conductive film interposer 250.

As further shown in FIG. 2, first selectively conductive film interposer 230 is configured to selectively couple at least one of micro-bumps 212 to at least one of micro-bumps 222. Moreover, according to the exemplary implementation shown by FIG. 2, second selectively conductive film interposer 250 is configured to selectively couple at least one of micro-bumps 242 to at least one of micro-bumps 212. In other words, first selectively conductive film interposer 230 is configured to provide electrical conduction path 234a for selectively coupling micro-bump 212a on top surface 211 of first active die 210 to micro-bump 222a on bottom surface 221 of second active die 220, as well as to selectively couple micro-bumps 212b and 212c to respective micro-bumps 222b and 222c by providing electrical conduction paths 234b and 234c, respectively. In addition, second selectively conductive film interposer 250 is configured to provide electrical conduction paths 254d and 254e for selectively coupling respective micro-bumps 242d and 242e on bottom surface 241 of third active die 240 to respective micro-bumps 212d and 212e on top surface 211 of first active die 210.

Second selectively conductive film interposer 250 includes interposer dielectric 252 and electrical conduction paths 254d and 254e established in interposer dielectric 252. Like interposer dielectric 132, in FIG. 1, interposer dielectric 252 may be a flexible dielectric formed of a polymer matrix, such as a B-stage polymeric film, for example, having conductive bodies such as conductive nano-wires or conductive nanotubes dispersed therein for selectively providing electrical conduction paths 254d and 254e, as described above by reference to selectively conductive film interposer 130, in FIG. 1. In some implementations, for example, such conductive bodies may be substantially uniformly distributed in interposer dielectric 252. Alternatively, second selectively conductive film interposer 250 may be formed from an anisotropic conductive film (ACF). In some implementations, for example, the dispersion of conductive bodies within the ACF may be programmed to selectively provide electrical conduction paths at desired locations within interposer dielectric 252 corresponding to electrical conduction paths 254d and 254e, in FIG. 2, while assuring dielectric integrity elsewhere.

According to the implementation shown in FIG. 2, third active die 240 is electrically connected to second selectively conductive film interposer 250 by micro-bumps 242. It is noted, however, that more generally, micro-bumps 242 may correspond to any electrical connectors suitable for coupling third active die 240 to second selectively conductive film interposer 250. Thus, in other implementations, micro-bumps 242 may be replaced by respective conductive posts or pillars such as, for example, metal posts or pillars formed of copper. Moreover, and as further shown by FIG. 2, second active die 220 is substantially enclosed by cavity 256 formed in second selectively conductive film interposer 250. As a result, a single selectively conductive film interposer, such as second selectively conductive film interposer 250 can be advantageously implemented to selectively interconnect first active die 210 and third active die 240 despite the intervening presence of second active die 220.

Continuing to FIG. 3, FIG. 3 shows flowchart 300, which describes an exemplary method for producing a semiconductor package having a selectively conductive film interposer. With respect to the method outlined in FIG. 3, it is noted that certain details and features have been left out of flowchart 300 in order not to obscure the discussion of the inventive features in the present application.

Referring to flowchart 300, in FIG. 3, with additional reference to FIG. 1, flowchart 300 begins when first active die 110 having electrical connectors in the form of micro-bumps 112 on top surface 111 is provided for packaging within semiconductor package 100 (310). Flowchart 300 continues with formation of selectively conductive film interposer 130 over top surface 111 of first active die 110 (320). As discussed above, selectively conductive film interposer 130 includes interposer dielectric 132, which may be a flexible dielectric formed of a polyimide film or other suitable polymer matrix having conductive bodies dispersed therein for selectively providing electrical conduction paths. Alternatively, selectively conductive film interposer 130 may be formed from ACF, for example, wherein the dispersion of conductive bodies within the ACF is programmed to selectively provide electrical conduction paths at desired locations within selectively conductive film interposer 130.

Flowchart 300 continues when second active die 120 including electrical connectors in the form of micro-bumps 122 on bottom surface 121 is placed over selectively conductive film interposer 130 (330). According to flowchart 300, selectively conductive film interposer 130 is then utilized to selectively couple at least one of micro-bumps 112 to at least one of micro-bumps 122 (340). For example, in some implementations, selectively conductive film interposer 130 may include a B-stage polymeric interposer dielectric 132 having conductive nano-wires or conductive nanotubes dispersed therein. As described above, the conductive nano-wires or nanotubes may be substantially uniformly distributed in interposer dielectric 132, and have their primary axes (e.g., length axis of nano-wire or nanotube) oriented substantially parallel to the plane of selectively conductive film interposer 130. An external field, such as an external electromagnetic field, for example, may be applied to interposer dielectric 132 to selectively reorient some of the conductive nano-wires or nanotubes dispersed therein so as to selectively form electrical conduction paths 134a, 134b, and 134c capable of coupling respective micro-bumps 112a, 112b, and 112c on top surface 111 of first active die 110 to respective micro-bumps 122a, 122b, and 122c on bottom surface 121 of second active die 120. Interposer dielectric 132 may then undergo a cure process, such as a UV cure or other radiation cure, for example, to establish electrical conduction paths 134a, 134b, and 134c within selectively conductive film interposer 130.

Referring to electrical conduction paths 134a, 134b, and 134c, in FIG. 1, and electrical conduction paths 234a, 234b, 234c, 254d, and 254e, in FIG. 2, it is noted that the present application enables the establishment of electrical conduction paths having their power capacity, e.g., current carrying capacity, as well as their location within their respective interposer dielectrics, may be selectively determined. For instance, electrical conduction paths 134a/234a and 254e, which may be implemented to provide high power connections, for example, are shown to be substantially broader than electrical conduction paths 134b/234b and 254d, which may be configured to mediate low power chip-to-chip signaling. Moreover, according to the implementations shown by FIGS. 1 and 2, electrical conduction paths 134c/234c may be implemented to support intermediate power communications between first active die 110/210 and second active die 120/220.

Thus, in contrast to conventional semiconductor packages in which an interposer typically includes an interposer dielectric layer and an interposer semiconductor substrate, the semiconductor packaging approach disclosed by the present application utilizes a selectively conductive film interposer from which an interposer semiconductor substrate has been omitted in order to reserve packaging space for additional active dies. In addition, the use of a selectively conductive film interposer, as disclosed herein, can enable relaxation of alignment constraints for the active dies interconnected within the semiconductor package. Moreover, the selectively conductive film interposers described by the present application are highly configurable, and may be implemented to include one or more cavities, for example, capable of substantially enclosing an active die or dies within the semiconductor package, as well as to provide electrical conduction paths having selectively determined locations and/or power capacities. Consequently, semiconductor packaging implementations utilizing such selectively conductive film interposers rather than the bulkier conventional interposers, which typically include an interposer dielectric formed over a relatively thick substrate, can advantageously enable massive packaging integration.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
a first active die having a first plurality of electrical connectors;
a selectively conductive film interposer situated over said first active die, said selectively conductive film interposer having conductive bodies dispersed therein;
a second active die having a second plurality of electrical connectors;
said selectively conductive film interposer configured to selectively couple at least one of said first plurality of electrical connectors to at least one of said second plurality of electrical connectors.

2. The semiconductor package of claim 1, wherein said selectively conductive film interposer comprises a polymer matrix having said conductive bodies dispersed therein.

3. The semiconductor package of claim 1, wherein said selectively conductive film interposer comprises a polymer matrix having nano-wires dispersed therein.

4. The semiconductor package of claim 1, wherein said selectively conductive film interposer comprises a polymer matrix having nanotubes dispersed therein.

5. The semiconductor package of claim 1, wherein said selectively conductive film interposer comprises a polymer matrix having said conductive bodies substantially uniformly dispersed therein.

6. The semiconductor package of claim 1, wherein said selectively conductive film interposer comprises an anisotropic conductive film (ACF).

7. A semiconductor package comprising:
a first active die having a first plurality of electrical connectors;
a first selectively conductive film interposer situated over said first active die;
a second active die having a second plurality of electrical connectors;
a second selectively conductive film interposer situated over said first and second active dies;
a third active die having a third plurality of electrical connectors;
said first selectively conductive film interposer configured to selectively couple at least one of said first plurality of electrical connectors to at least one of said second plurality of electrical connectors.

8. The semiconductor package of claim 7, wherein said second selectively conductive film interposer is configured to selectively couple at least one of said third plurality of electrical connectors to at least one of said first plurality of electrical connectors.

9. The semiconductor package of claim 7, wherein said second selectively conductive film interposer has a cavity therein, and wherein said second active die is substantially enclosed within said cavity.

10. The semiconductor package of claim 7, wherein at least one of said first selectively conductive film interposer and said second selectively conductive film interposer comprises a polymer matrix having conductive bodies dispersed therein.

11. The semiconductor package of claim 7, wherein at least one of said first selectively conductive film interposer and said second selectively conductive film interposer comprises a polymer matrix having nano-wires dispersed therein.

12. The semiconductor package of claim 7, wherein at least one of said first selectively conductive film interposer and said second selectively conductive film interposer comprises a polymer matrix having nanotubes dispersed therein.

13. The semiconductor package of claim 7, wherein at least one of said first selectively conductive film interposer and said second selectively conductive film interposer comprises a polymer matrix having conductive bodies substantially uniformly dispersed therein.

14. The semiconductor package of claim 7, wherein at least one of said first selectively conductive film interposer and said second selectively conductive film interposer comprises an anisotropic conductive film (ACF).

15. A method for producing a semiconductor package, said method comprising:
providing a first active die having a first plurality of electrical connectors;
forming a selectively conductive film interposer over said first active die;
placing a second active die over said selectively conductive film interposer, said second active die having a second plurality of electrical connectors;
utilizing said selectively conductive film interposer to selectively couple at least one of said first plurality of electrical connectors to at least one of said second plurality of electrical connectors.

16. The method of claim 15, wherein said selectively conductive film interposer comprises a polymer matrix having conductive bodies dispersed therein.

17. The method of claim 15, wherein said selectively conductive film interposer comprises a polymer matrix having nano-wires dispersed therein.

18. The method of claim 15, wherein said selectively conductive film interposer comprises a polymer matrix having nanotubes dispersed therein.

19. The method of claim 15, wherein said selectively conductive film interposer comprises a polymer matrix having conductive bodies substantially uniformly dispersed therein.

20. The method of claim 15, wherein said selectively conductive film interposer comprises an anisotropic conductive film (ACF).

* * * * *